(12) United States Patent
Wu et al.

(10) Patent No.: US 11,380,370 B2
(45) Date of Patent: Jul. 5, 2022

(54) SEMICONDUCTOR DEVICE HAVING A CHARGE PUMP

(71) Applicant: Micron Technology, Inc., Boise, ID (US)

(72) Inventors: Jun Wu, Shanghai (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/646,503

(22) PCT Filed: Sep. 22, 2017

(86) PCT No.: PCT/CN2017/102907
§ 371 (c)(1),
(2) Date: Mar. 11, 2020

(87) PCT Pub. No.: WO2019/056294
PCT Pub. Date: Mar. 28, 2019

(65) Prior Publication Data
US 2020/0273502 A1  Aug. 27, 2020

(51) Int. Cl.
*G11C 5/14* (2006.01)
*G11C 11/4074* (2006.01)
(Continued)

(52) U.S. Cl.
CPC .......... *G11C 5/145* (2013.01); *G11C 11/4074* (2013.01); *G11C 16/30* (2013.01); *H02M 3/07* (2013.01); *H02M 3/073* (2013.01)

(58) Field of Classification Search
CPC ..... G11C 5/145; G11C 11/4074; G11C 16/30; G11C 5/146; H02M 3/07; H02M 3/073;
(Continued)

(56) References Cited

U.S. PATENT DOCUMENTS 8,022,750 B2 * 9/2011 Nakamura ............ H02M 3/073
327/536
8,149,045 B2   4/2012 Pan
2008/0150619 A1 6/2008 Lesso et al.

FOREIGN PATENT DOCUMENTS

CN    104883051 A    9/2015
CN    105515370 A    4/2016
(Continued)

OTHER PUBLICATIONS

"International Application Serial No. PCT CN2017 102907, International Preliminary Report on Patentability dated Apr. 2, 2020", 5 pgs.

(Continued)

*Primary Examiner* — Jung Kim
(74) *Attorney, Agent, or Firm* — Schwegman Lundberg & Woessner, P.A.

(57) ABSTRACT

Apparatus and methods that have a semiconductor charge pump can be implemented in a variety of applications. Such a charge pump can have a charge pump unit core that includes a pump section and a single passgate coupled to the pump section to transfer charge, where the single passgate is a n-channel metal-oxide semiconductor (NMOS) transistor coupled directly to an input and an output of the charge pump unit core. The transfer of charge can be based on a set of clock signals. Additional apparatus, systems, and methods are disclosed.

20 Claims, 12 Drawing Sheets

(51) Int. Cl.
    *G11C 16/30*        (2006.01)
    *H02M 3/07*         (2006.01)
(58) Field of Classification Search
    CPC ..... H02M 2003/075; H02M 2003/077; H02M
                       2003/078; H02M 2003/076
    See application file for complete search history.

(56)            References Cited

FOREIGN PATENT DOCUMENTS

CN          111226387       6/2020
WO      WO-2019056294 A1    3/2019

OTHER PUBLICATIONS

"International Application Serial No. PCT/CN2017/102907, International Search Report dated Jun. 29, 2018", 4 pgs.
"International Application Serial No. PCT/CN2017/102907, Written Opinion dated Jun. 29, 2018", 4 pgs.
Anil, Aamna, "A High Efficiency Charge Pump for Low Voltage Devices", International Journal of VLSI design & Communication Systems (VLSICS) vol. 3, No. 3, (Jun. 2012), 14 pgs.

* cited by examiner

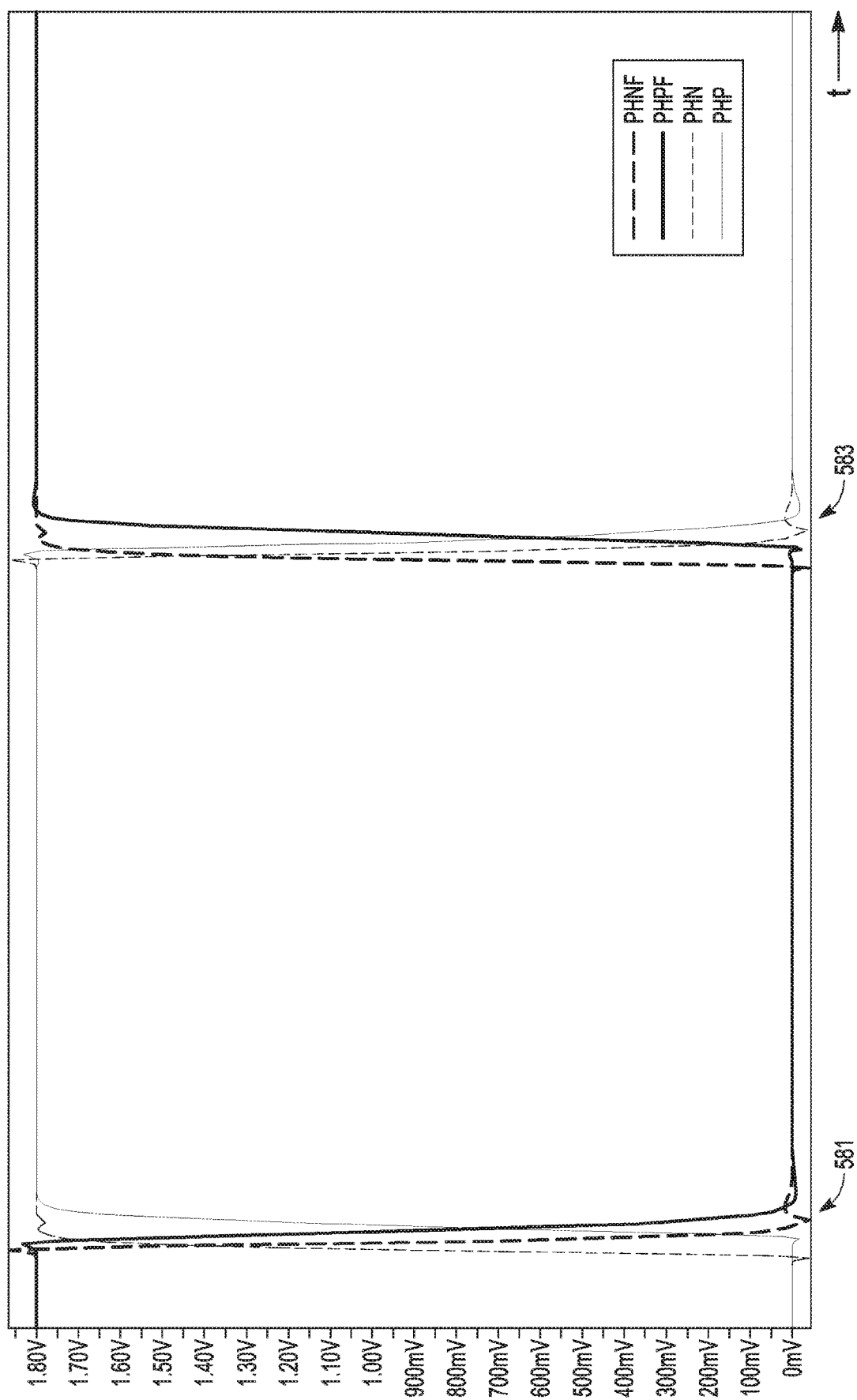

US 11,380,370 B2

SEMICONDUCTOR DEVICE HAVING A CHARGE PUMP

PRIORITY APPLICATION

This application is a U.S. National Stage Application under 35 U.S.C. 371 from International Application No. PCT/CN2017/102907, filed 22 Sep. 2017, published as WO 2019/056294, which is incorporated herein by reference in its entirety.

BACKGROUND

Current charge pumps, which are used in various products such as a dynamic random access memory (DRAM), use passgates for charge sharing. Such passgates are typically implemented as an arrangement of metal-oxide semiconductor (MOS) transistors with a p-channel metal-oxide semiconductor (PMOS) transistor in series with a n-channel metal-oxide semiconductor (NMOS) transistor. FIG. 1 shows a conventional unit core 101 of a charge pump with input 102 and output 112, which can be implemented in a number of integrated circuits. Unit core 101 can be used as a number of stages in a charge pump. Unit core 101 has a boost section including an inverter driver 117 responsive to a boost clock signal and a boost capacitor, Cb, 118, and a pump section including an inverter driver 113 responsive to a pump clock signal and a pump capacitor, Cpmp, 114. NMOS transistor 106 and PMOS transistor 103 are arranged in series relative to input/output 102 and 112 and are the main passgates for charge transferring by unit core 101. Transistor 105 is configured to generate bulk voltage for all NMOS transistors in unit core 101. Transistors 107 and 108 are configured to generate bulk voltage for all PMOS transistors in unit core 101.

The semiconductor device industry has a market driven need to improve operation of semiconductor based devices. Improvements to such devices may be addressed by advances in the design of circuits integrated within such semiconductor devices including improvements to charge pumps.

BRIEF DESCRIPTION OF THE DRAWINGS

FIG. 5 shows an example of clock signals to the charge pump of FIG. 3, according to various embodiments.

DETAILED DESCRIPTION

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In various embodiments, a charge pump for integrated circuits can be implemented with a structure using only a NMOS transistor as a passgate in a unit core for charge sharing. A charge pump having NMOS only passgate structures can be operated with timing of clock phases modified according to the structure associated with a NMOS only passgate in a unit core of a charge pump. Charge pumps with unit cores having only a NMOS transistor as a passgate can provide higher efficiency and smaller layout area on a chip than unit cores having a PMOS transistor plus NMOS transistor in series with respect to input and output of the respective unit core. An arrangement of transistors in the unit core having a NMOS only passgate can control of bulk voltage of the NMOS transistor to remove the impact of threshold voltage, $V_t$, of the NMOS.

Figure 1:
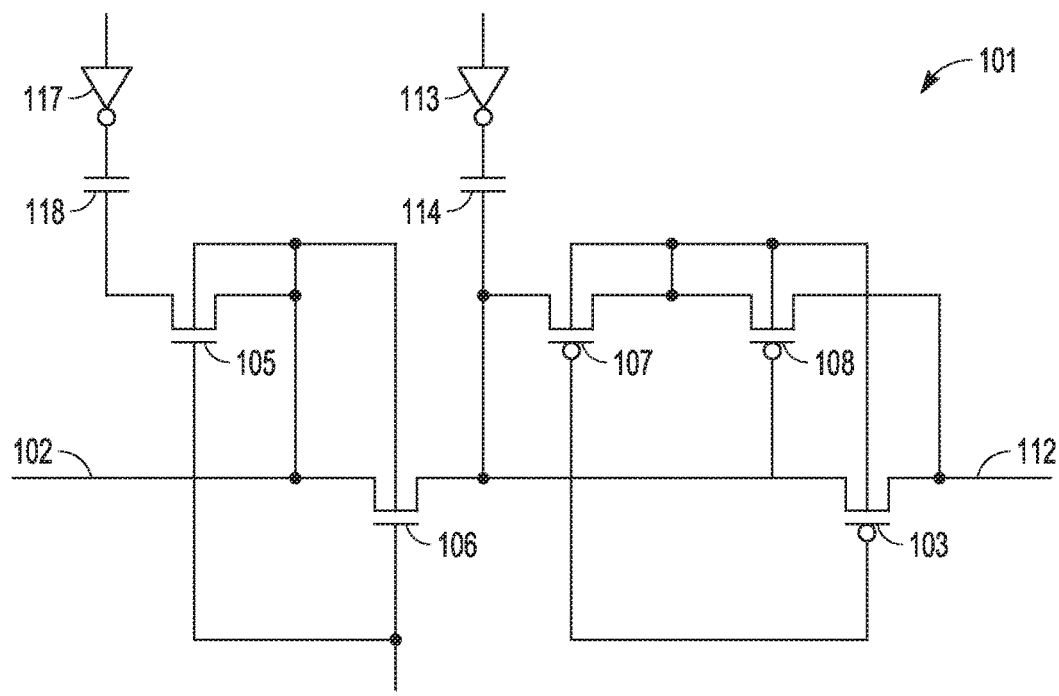
FIG. 1 shows a conventional unit core of a charge pump with an input and an output, which can be implemented in a number of integrated circuits.
Figure 2:
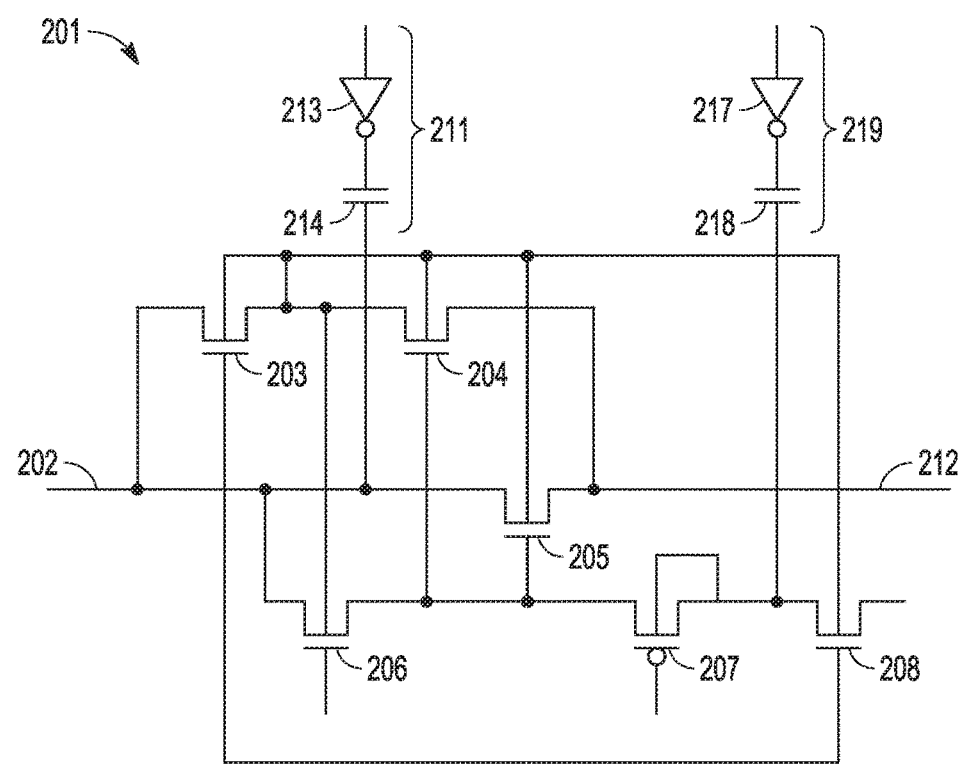
FIG. 2 is a schematic of an example unit core of a charge pump in which the unit core has a n-channel metal-oxide semiconductor transistor as the only passgate of the unit core, according to various embodiments.

FIG. 2 is a schematic of an embodiment of an example unit core of a charge pump in which the unit core has a NMOS transistor as the only passgate of the unit core 201. Unit core 201 has a boost section 219 including an inverter driver 217 responsive to a boost clock signal coupled to inverter driver 217 and a boost capacitor, Cb, 218, and a pump section 211 including an inverter driver 213 responsive to a pump clock signal coupled to inverter driver 213 and a pump capacitor, Cpmp, 214. NMOS transistor 205 is the main passgate for charge transferring. NMOS transistor 205 can be arranged as a single passgate coupled to the pump section 211 to transfer charge with respect to the pump section 211 based on the multiple clock signals, where NMOS transistor 205 is coupled directly to an input 202 and an output 212 of the charge pump unit core 201. NMOS transistor passgate 205 can control transfer of charge from Cpmp 214 of unit core 201 to an adjacent unit core arranged in a multi-stage charge pump or to another circuit in device when unit core 201 is arranged as the only stage of a charge pump or a final stage of a charge pump.

Transistors 206, 207, and 208 can be configured to generate gate voltage for transistor 205. Connections to the gates of transistors 206, 207, and 208 can supply appropriate control voltages from outside the unit core 201. The gates of transistors 206, 207, and 208 may be connected to have voltage supplied by another unit core that is a complementary unit core to unit core 201. Transistors 203 and 204 are configured to a generate bulk voltage for all NMOS transistors in unit core 201. Transistors 206, 207, and 208 can be arranged as a set of control transistors. Charge pump unit core 201 can include a control transistor, such as transistor 207, coupled to the single passgate 205 to control the single passgate 205 and coupled to boost section 219. Control transistor 207 can be coupled to a gate of the single passgate 205 with boost capacitor 218 of boost section 219 coupled to a source of control transistor 207.

Charge pump unit core 201 can be integrated in a semiconductor device. A charge pump having a charge pump unit core similar or identical to charge pump unit core 201 can be used in a number of memory devices such as, but not limited to DRAM devices and flash devices. Charge pump unit core 201 can be disposed in an integrated circuit in a mobile communications device, or other applications.

Figure 3:
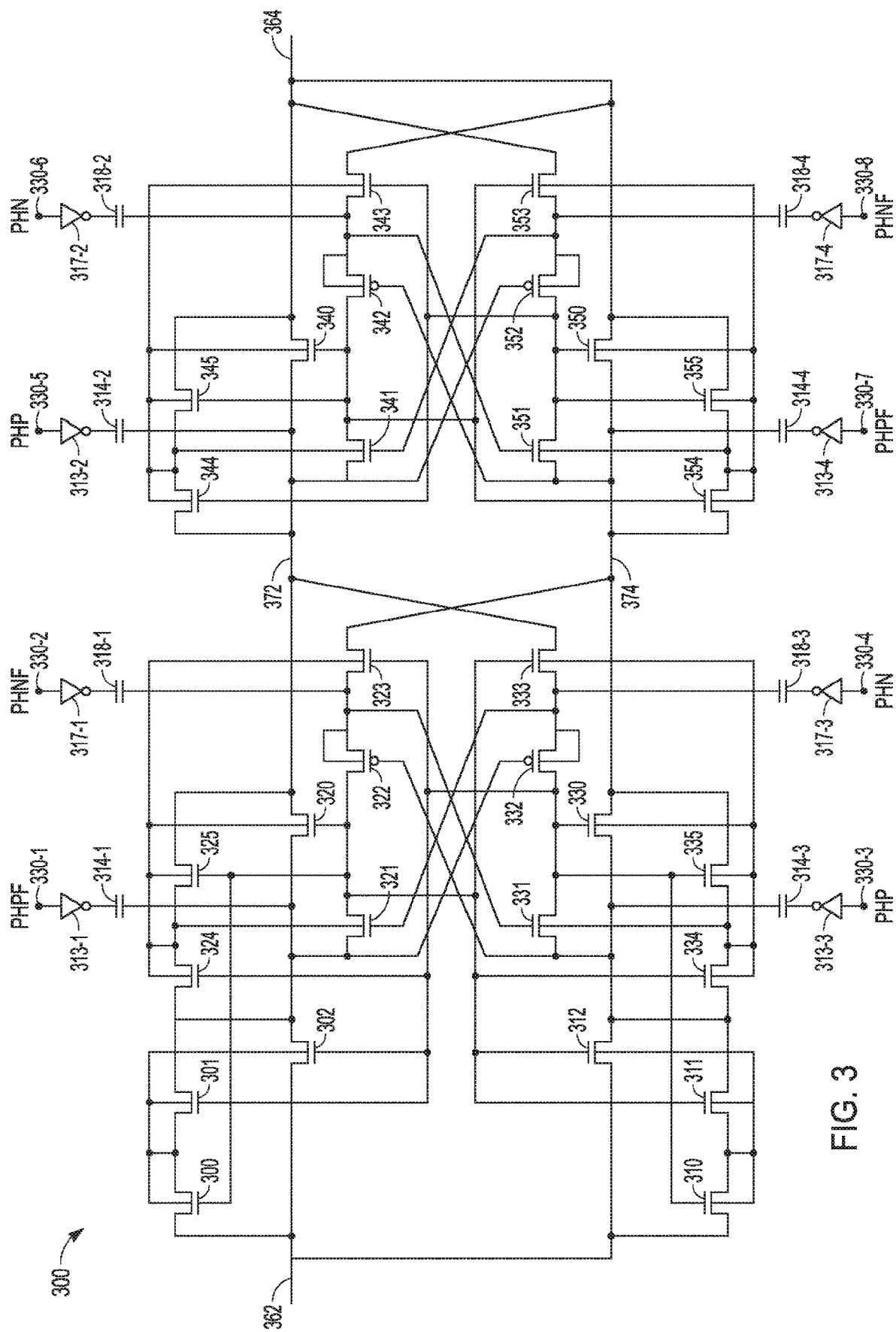
FIG. 3 is a schematic of an example charge pump having two stages with two complemental stages, according to various embodiments.

FIG. 3 is a schematic of a charge pump 300 having two stages with two complementary stages. Charge pump 300 may be integrated into a semiconductive device having nodes 330-1, 330-2, 330-3, 330-4, 330-5, 330-6, 330-7, and 330-8 to distribute clock signals. However, when clock signals are common to different portions of charge pump 300, the nodes providing the common signals to charge pump 300 may be combined. Though two stages with two complementary stages are shown, charge pump 300 can have addition stages and complementary stages. Charge pump 300 can include a set of charge pump unit cores, where each charge pump unit core can be coupled to receive a number of the clock signals from the nodes 330-1, 330-2, 330-3, 330-4, 330-5, 330-6, 330-7, and 330-8, and each charge pump unit core can include features similar to those of charge pump unit core 201 of FIG. 2.

Transistors 320, 321, 322, 323, 324, and 325 are six MOS transistors that can be arranged to form a unit core, which can be labeled unit core 1. Transistor 322 can be a PMOS transistor. Transistors 330, 331, 332, 333, 334, and 335 are six MOS transistors that can be arranged to form another unit core, which can be labeled unit core 2. Transistor 332 can be a PMOS transistor. Transistors 340, 341, 342, 343, 344, and 345 are six MOS transistors that can be arranged to form another unit core, which can be labeled unit core 3. Transistor 342 can be a PMOS transistor. Transistors 350, 351, 352, 353, 354, and 355 are six MOS transistors that can be arranged to form another unit core, which can be labeled unit core 4. Transistor 352 can be a PMOS transistor. As shown in FIG. 3, the transistors of unit core 1 can be arranged with the transistors of unit core 2 in a complementary fashion. Unit core 1 is the complement of unit core 2 and unit core 2 is a complement of unit core 1. Unit core 1 and unit core 2 are stages at the input of charge pump 300 and are first stages of charge pump 300. For convenience, the stage having unit core 1 can be referred to as a first stage or stage one and the stage having unit core 2 can be referred to as a first complement stage or complement stage one, though as noted above the labeling is interchangeable. Similarly, the transistors of unit core 3 can be arranged with the transistors of unit core 4 in a complementary fashion. Unit core 3 is the complement of unit core 4 and unit core 4 is a complement of unit core 3. Unit core 3 and unit core 4 are stages coupled to the first stage and the first complement stage and have an output at 364. For convenience, the stage having unit core 3 can be referred to as a second stage or stage two and the stage having unit core 4 can be referred to as a second complement stage or complement stage two. The output of stage one is coupled to the input of stage two and the output of complemental stage one is coupled to the input of complemental stage two. The architecture using complementary stages can provide complementary signals for control usage in charge pump 300, for example, such as timing control usage and turning-on/turning-off MOS usage.

Auxiliary MOS transistors can be included in the structure of charge pump 300 for pre-charging. The pre-charging can be directed to only first stages. For example, transistors 300, 301, and 302 are auxiliary MOS transistors for stage one, unit core 1 that may be provided for pre-charging only the first stage and not the second stage to which the first stage is coupled. In addition, transistors 310, 311, and 312 are auxiliary MOS for complementary stage one, unit core 2 that may be provided for pre-charging only the first complementary stage and not the second complementary stage to which the first complementary stage is coupled. The set of auxiliary transistors are coupled at input 362. The set of auxiliary transistors can be arranged for pre-charging without structured in a stage having a capacitor.

In operation, a number of clock signals can be applied to charge pump 300. A clock signal, PHP, at node 330-3 can be applied to an input of an inverter driver 313-3 that has an output coupled to a pump capacitor 314-3 of a pump section of unit core 2 of complement stage one. A clock signal, PHN, at node 330-4 can be applied to an input of an inverter driver 317-3 that has an output coupled to a boost capacitor 318-3 of a boost section of unit core 2 of complement stage one. Clock signal, PHP, at node 330-5 can be applied to an input of an inverter driver 313-2 that has an output coupled to a pump capacitor 314-2 of a pump section of unit core 3 of stage two. Clock signal, PHN, at node 330-6 can be applied to an input of an inverter driver 317-2 that has an output coupled to a boost capacitor 318-2 of a boost section of unit core 3 of stage two.

A clock signal, PHPF, at node 330-1 can be applied to an input of an inverter driver 313-1 that has an output coupled to a pump capacitor 314-1 of a pump section of unit core one of stage one. A clock signal, PHNF, at node 330-2 can be applied to an input of an inverter driver 317-1 that has an output coupled to a boost capacitor 318-1 of a boost section of unit core one of stage one. Clock signal, PHPF, at node 330-7 can be applied to an input of an inverter driver 313-4 that has an output coupled to a pump capacitor 314-4 of a pump section of unit core 4 of complemental stage two. Clock signal, PHNF, at node 330-8 can be applied to an input of an inverter driver 317-4 that has an output coupled to a boost capacitor 318-4 of a boost section of unit core 4 of complemental stage two.

Clock signal PHPF can be a complement to clock signal PHP. Clock signal PHNF can be a complement to clock signal PHN. FIG. 3 shows an example in which two stages and the two complementary stages are arranged such that the clock signals received by one of the two stages are the clock signals received by the complement stage of the other one of the two stages.

Charge pump 300 can include a first stage followed by a second stage with an input node of stage two coupled to an output node of stage one at 372. In addition, charge pump 300 can include a first complementary stage followed by a second complementary stage with an input node of complemental stage two coupled to an output node of complementary stage one at 374. Stage one can include a first set of transistors (321, 322, and 323) to control the passgate 320 of stage one with transistor. 323, of the first set of transistors (321, 322, and 323) coupled to the input node 374 of complemental stage two and coupled to boost capacitor 318-1 of the boost section of stage one. In this configuration, complemental stage one can include a first complemental set of transistors (331, 332, and 333) to control the passgate 330 of complemental stage one with one transistor, 333, of the first complemental set of transistors (331, 332, and 333) coupled to the input node 372 of stage two and coupled to boost capacitor 318-3 of the boost section of complemental stage one. Stage two and complemental stage two can have transistors arranged in a corresponding manner as arranged in stage one and complemental stage one.

Figure 4:
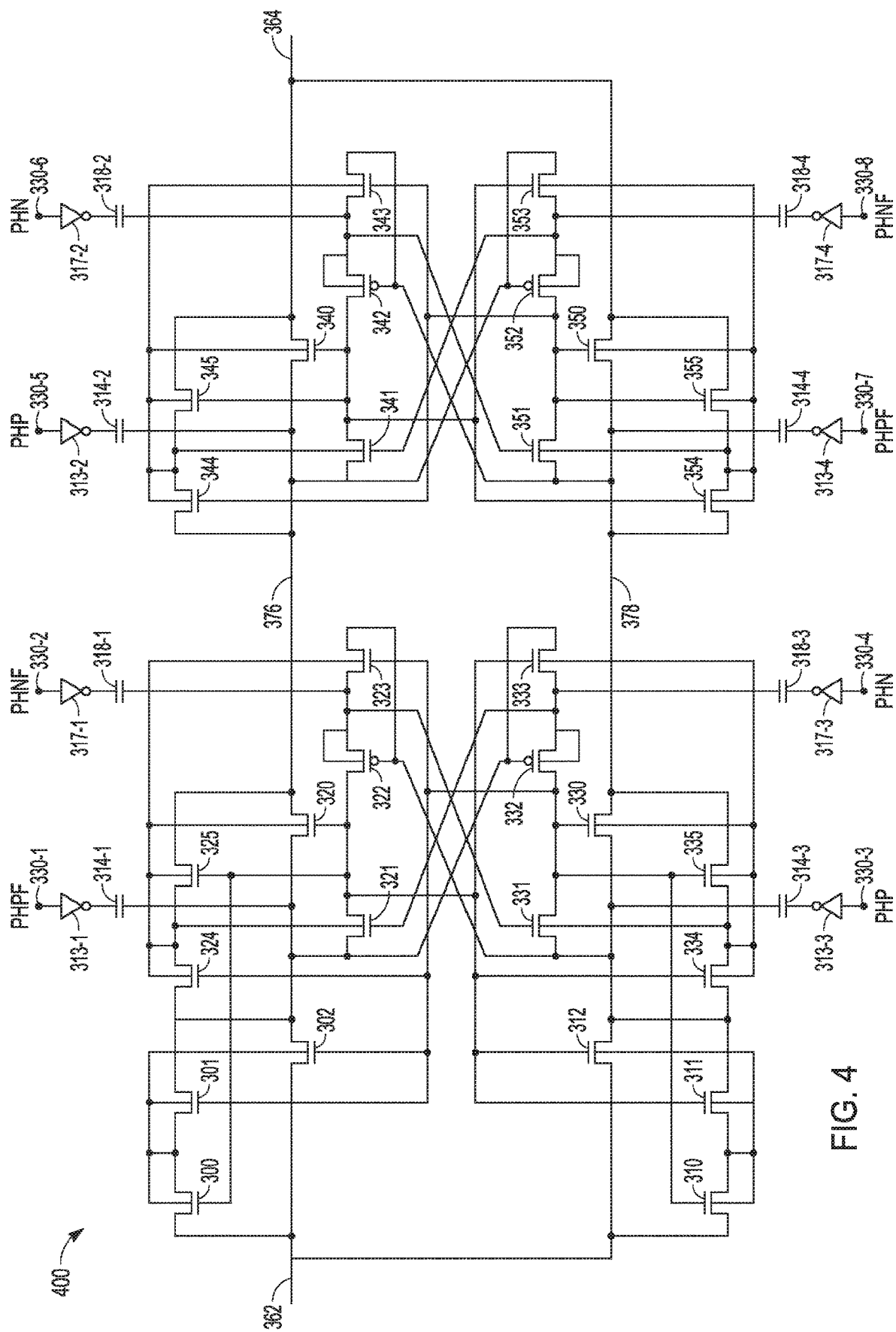
FIG. 4 is a schematic of an example charge pump having two stages with two complemental stages arranged as in charge pump of FIG. 3 with the coupling of stages modified, according to various embodiments.

FIG. 4 is a schematic of a charge pump 400 having two stages with two complemental stages arranged as in charge pump 300 of FIG. 3 with the coupling of stages modified. The layout of charge pump 400 differs from charge pump 300 in the coupling of transistors 323 and 333; therefore this discussion uses the designations of FIG. 3. In the configuration of charge pump 400, charge pump 400 includes stage one followed by stage two with an input node of stage two coupled to an output node of stage one at 376. In addition, complemental stage one is followed by complemental stage two with an input node of complemental stage two coupled to an output node of complemental stage one at 378. Stage one can include a first set of transistors (321, 322, and 323) to control the passgate 320 of the stage one with transistor, 322, of the first set of transistors (321, 322, and 323) coupled to a gate of passgate 320 of stage one and with transistor 323 of the first set of transistors (321, 322, and 323) is coupled to boost capacitor 418-1 of the boost section of stage one and coupled to a gate of transistor 322 of the first set of transistors (321, 322, and 323). In this configuration, complemental stage one can include a second set of transistors (331, 332, and 333) to control passgate 330 of complemental stage one with transistor 332 of the second set of transistors (331, 332, and 333) coupled to a gate of the passgate 320 of complemental stage one and transistor 333 of the second set of transistors (331, 332, and 333) coupled to boost capacitor 318-3 of the boost section of complemental stage one and coupled to a gate of transistor 332 of the second set of transistors (331, 332, and 333). Stage two and complemental stage two can have transistors arranged in a corresponding manner as arranged in stage one and complemental stage one.

FIG. 5 shows an example of clock signals to charge pump 300 of FIG. 3. These clock signals include PHNF, PHPF, PHN, and PHP. These clock signals can be generated as different phases from a clock generator or as independent waveforms from different signal sources.

Figure 6A:
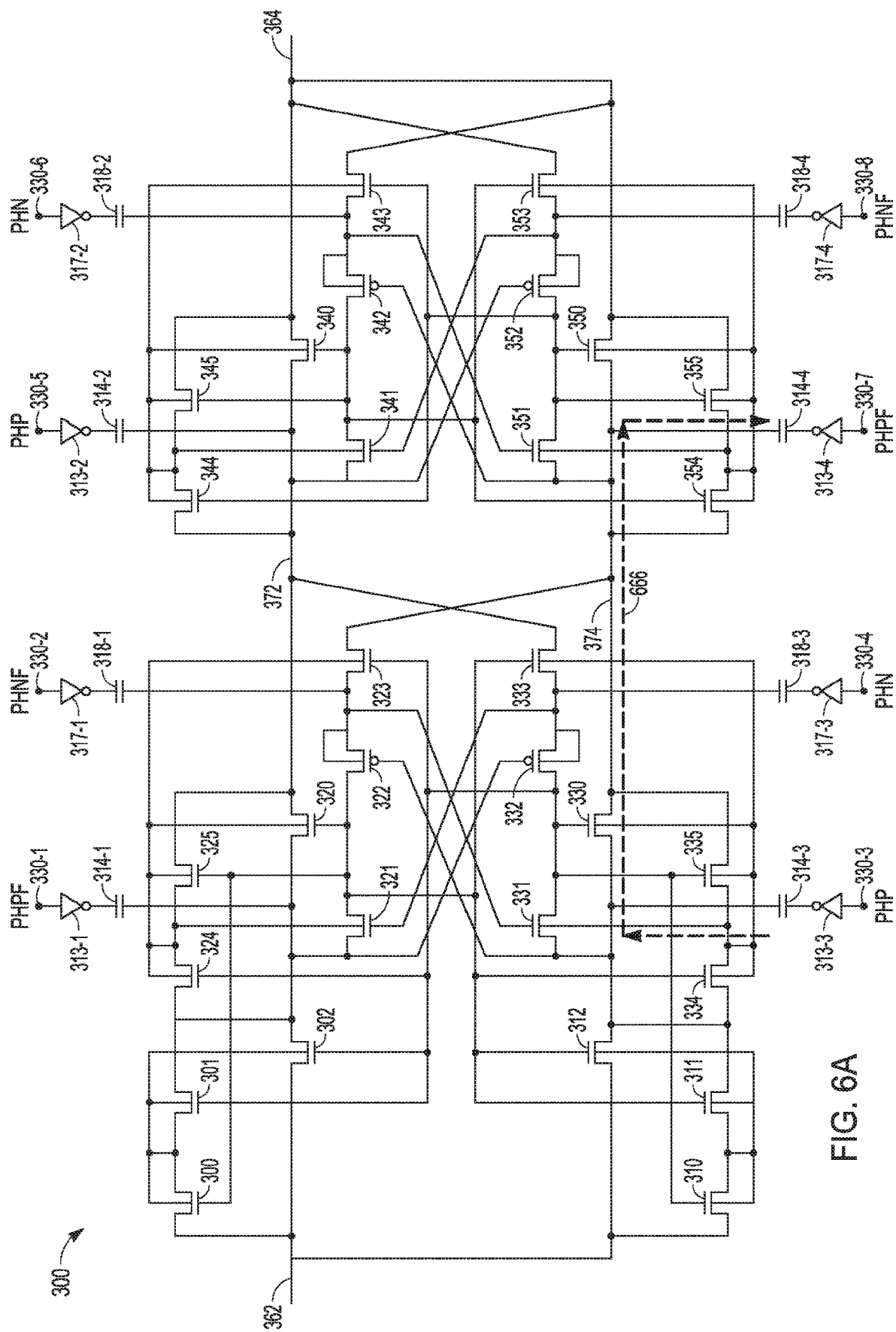
FIG. 6A shows an example of operation of the charge pump of FIG. 3 in which charges are transferred along a path from a pump capacitor of one stage to charge a pump capacitor of a next stage, according to various embodiments.
Figure 6B:
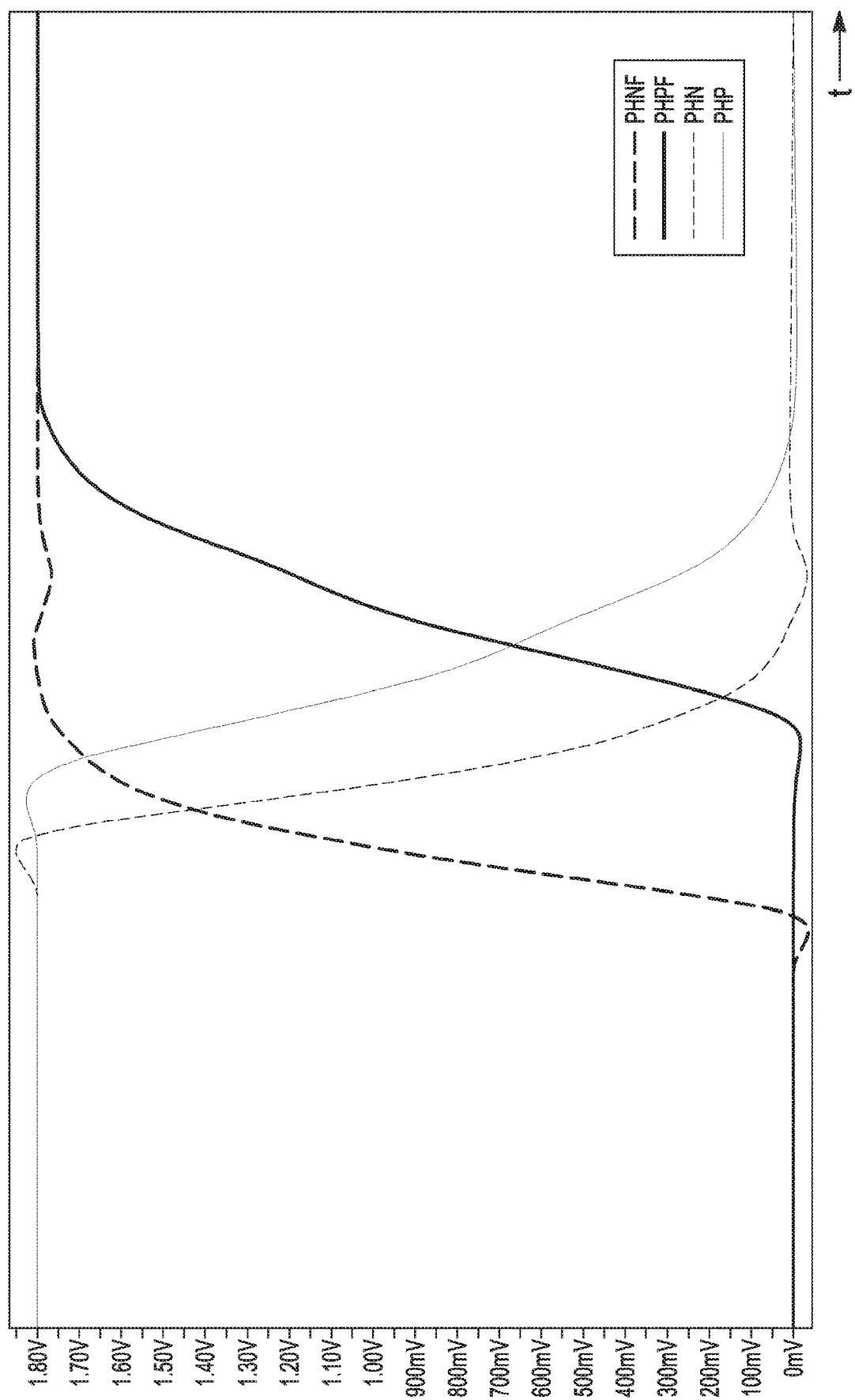
FIG. 6B shows an example of timing of the operation of charge transfer along the path shown in FIG. 6A, according to various embodiments.

FIG. 6A shows an embodiment of an example of operation of charge pump 300 in which charges are transferred along path 666 from pump capacitor 314-3 of one stage to charge pump capacitor 314-4 of the next stage, based on the timing shown in FIG. 6B. When PHNF goes to a high, gate of transistor 331 is pulled from high to low, so transistor 331 is cut-off. At the same time, gate of transistor 320 is also pulled from high to low, because gate of transistor 322 is low, and transistors 320, 300, 325, 311, 312, 333, and 334 also go to cut-off. Transistor 350 is in the same situation as transistor 320, so gates of transistors 350, 355, 343, and 344 go to a low and these transistors become cut-off also.

Then, PHN goes to a low and a gate of transistor 321 is pulled from low to high, so gate of transistor 332 is shorted to gate of transistor 320, because transistor 321 is turned-on. Because, at this time, gates of transistors 332 and 320 are still higher than gate of transistor 330, so transistor 332 comes to a weak on status, so gate of transistor 330 is ramping up a little bit slowly, so transistors 330, 310, 335, 301, 302, 323, and 324 are still not turned on. Transistor 340 is in the same situation as transistor 330, so transistors 340, 345, 353, and 354 are also still not turned on.

Then, PHP goes to a low, and a gate of transistor 322 is pulled from low to high, so transistor 322 becomes cut-off. Transistor 352 is in the same situation as transistor 322, so transistor 352 also becomes cut-off. Then, PHPF goes to a high, gate of transistor 332 is pulled to be lower, and then gate of transistor 330 starts to ramp up to the same level as gate of transistor 321 gate. So, transistors 330, 310, 335, 301, 302, 323, and 324 start to become on, and at the same time gate of transistor 342 also is pulled low, such that charges on pump capacitor 314-3 starts to flow to pump capacitor 314-4. Finally, level of gate of transistor 330 gate is stable on the same high level as the gate of transistor 321, so pump capacitor 314-3 and pump capacitor 314-4 finish charge transferring.

The above example relates to actions of the transistors of charge pump 300 during clock switching similar to clock switching 583 of FIG. 5. Charge is transferred from the pump capacitor 314-3 to pump capacitor 314-4, and transistors 312 and 350 are cut-off, while transistor 330 is turned on. Pump capacitor 314-1 is pre-charged and charge of pump capacitor 314-2 is dumped to pump output at 364. Transistor 320 is cut-off, while transistors 302 and 340 are turned-on. During clock switching 581 of FIG. 5, charge is transferred from pump capacitor 314-1 to pump capacitor 314-2, and transistors 302 and 340 are cut-off, while transistor 320 is turned on. Pump capacitor 314-3 is pre-charged and charge of pump capacitor 314-4 is dumped to pump output at 364. Transistor 330 is cut-off, while transistors 312 and 350 are turned-on.

Figure 7A:
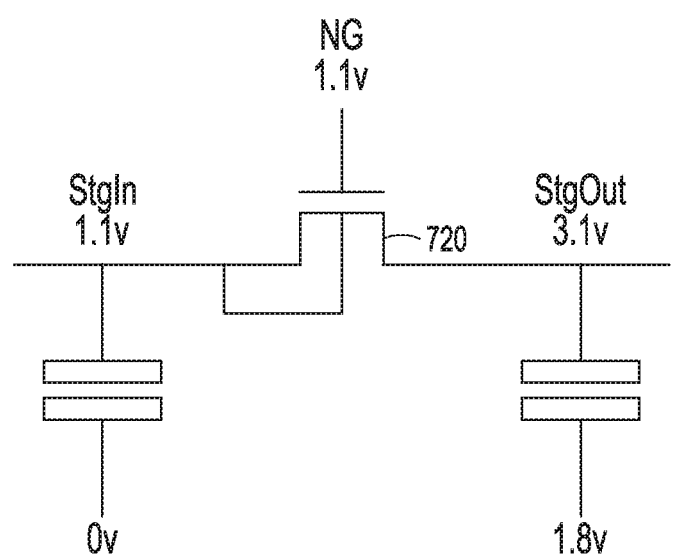
FIGS. 7A-7D illustrate voltage states associated with charge transferring using a single n-channel metal-oxide semiconductor transistor as a passgate, according to various embodiments.
Figure 7B:
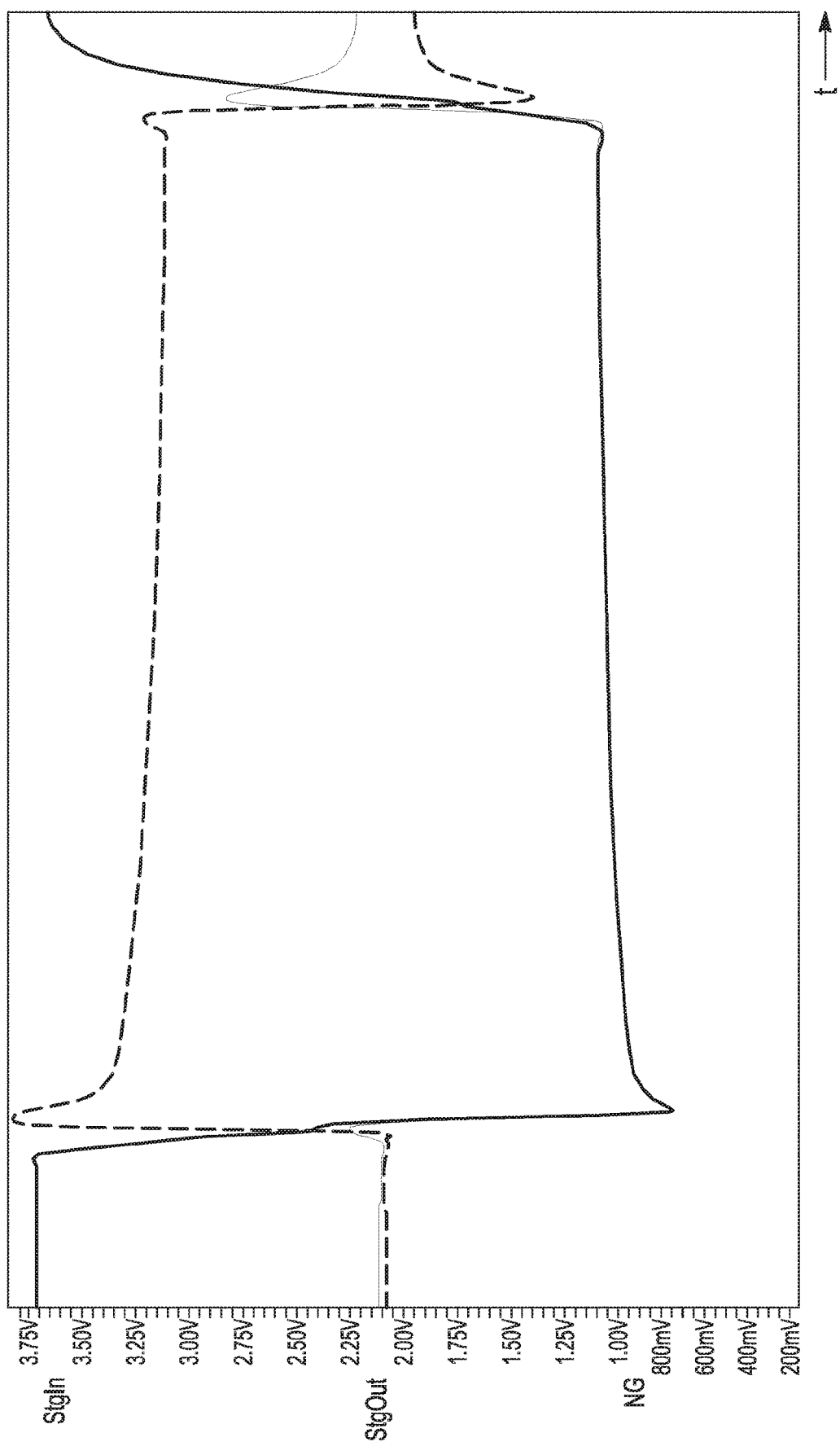
Figure 7C:
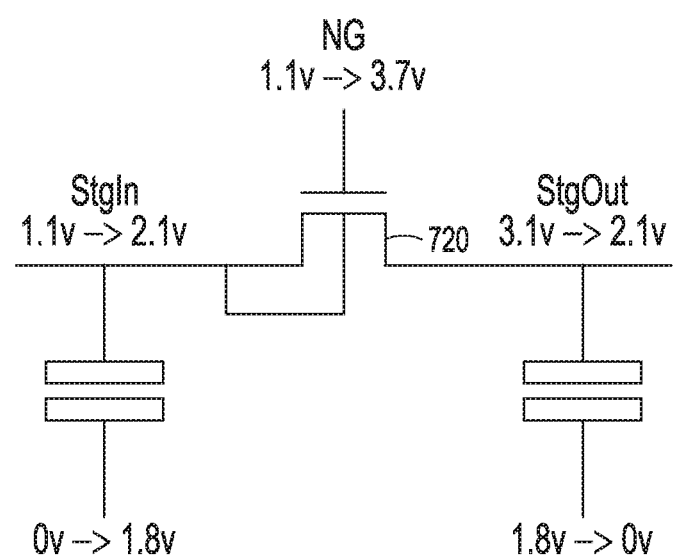
Figure 7D:
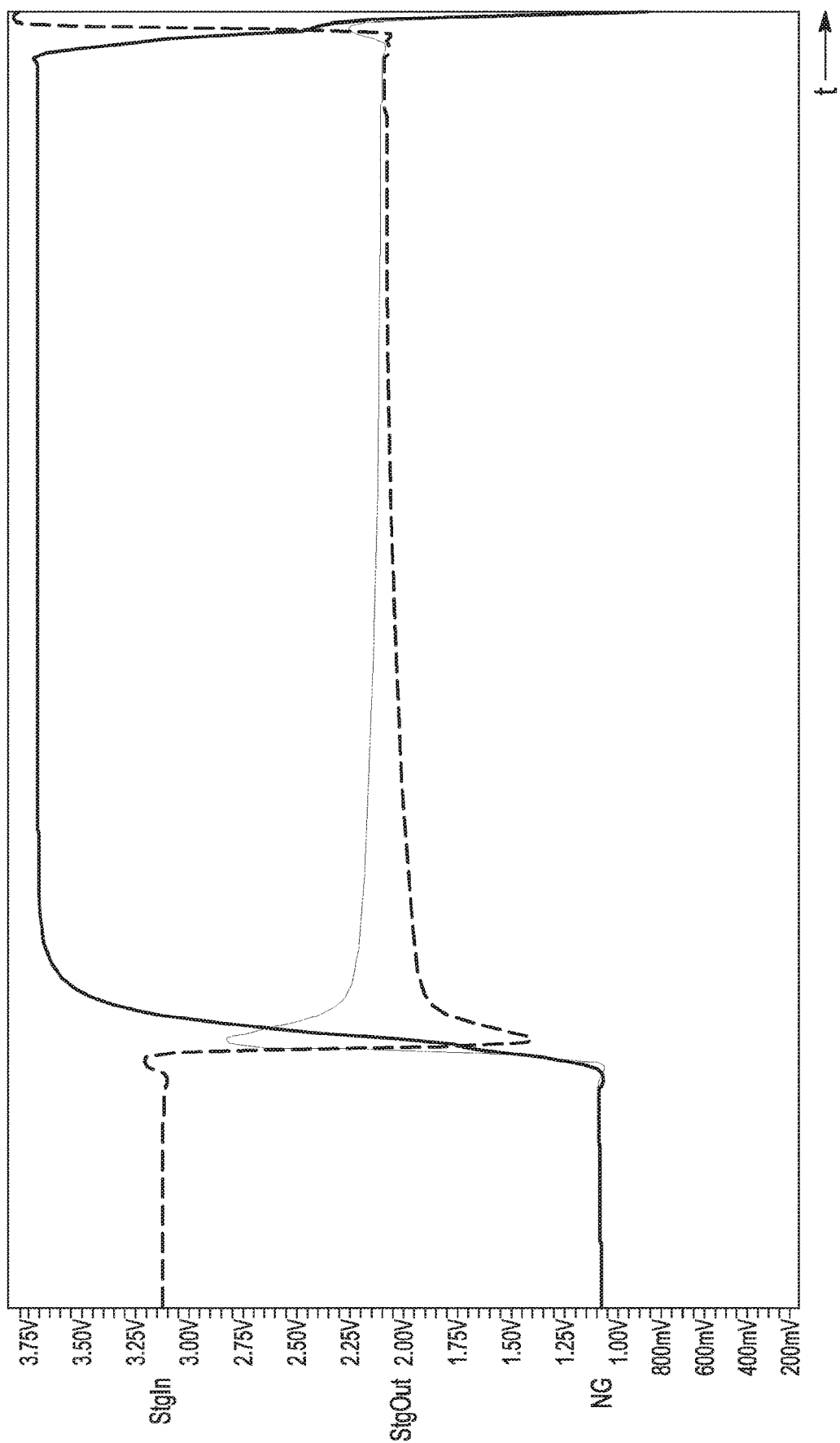

FIGS. 7A-7D illustrate voltage states associated with charge transferring using a single NMOS transistor 720 as a passgate. FIGS. 7A-7B illustrate a state during pre-charge before charge transferring. FIGS. 7C-7D illustrate a state during charge transferring phase. During charge transferring, the voltage between the gate (NG) and source, Vgs, of NMOS passgate is about at a supply voltage of the pump, Vccpmp, such as Vccpmp=1.8V. Because only one NMOS passgate used during charge transferring, charge transferred is not limited by PMOS as in the conventional approach. In a conventional approach of a NMOS coupled to a PMOS, charge transferring is mostly limited by the size of the PMOS. In embodiments, using only a NMOS passgate, the NMOS passgate size can be much less than total size for the combination of NMOS and PMOS passgates coupled together for the conventional charge pump. In theory, with less passgate size, higher pump power, current, and area efficiency can be attained.

In simulations of the conventional charge pump and an embodiment of a charge pump with a single NMOS passgate over a number of operating supply voltages, it can be shown that the charge pump with the single NMOS passgate has a significantly higher current capacity when the charge pump output is less than 2.5V and a slightly improved current efficiency and power efficiency.

Figure 8:
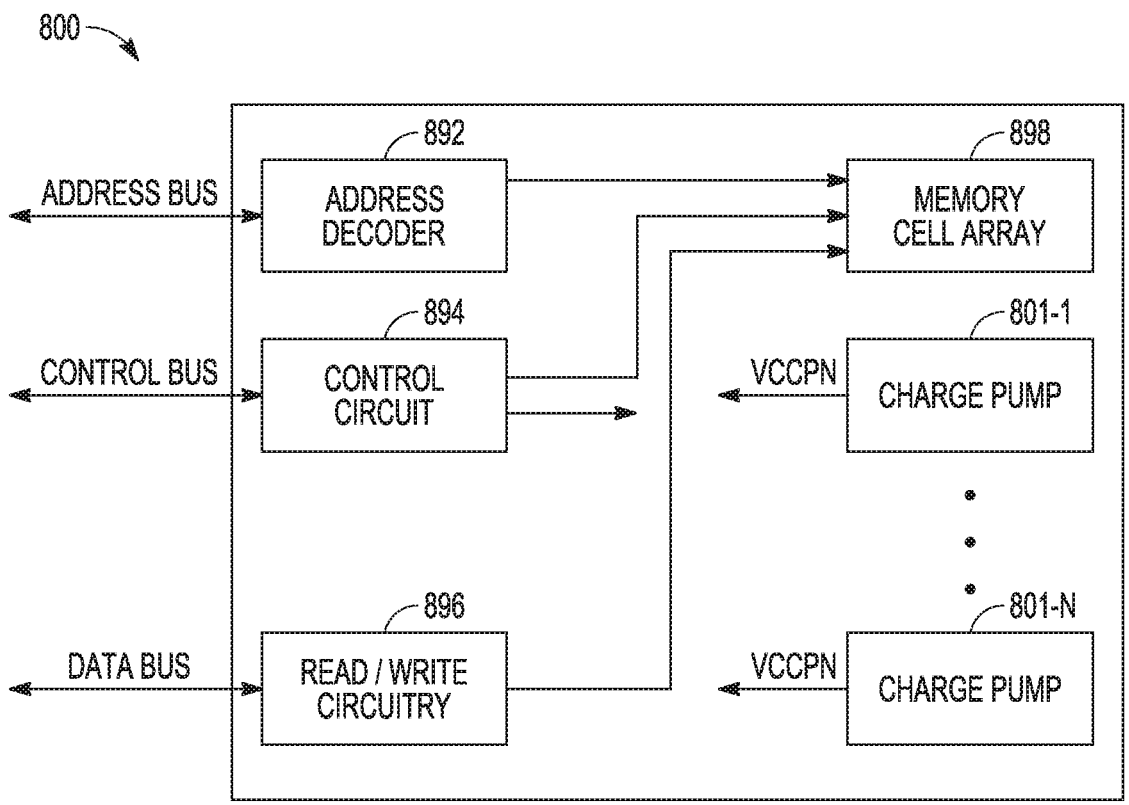
FIG. 8 is a block diagram of features of a dynamic random access memory including a set of charge pumps, according to various embodiments.

FIG. 8 is a block diagram of features of a DRAM 800 including a set of charge pumps 801-1 . . . 801-N. Charge pumps 801-1 . . . 801-N have an architecture having a single NMOS transistor passgates in the unit cores of the stages of each respective charge pump in accordance with the teaching herein. As demonstrated by the example configurations of charge pumps 300 of FIG. 3 and 400 of FIG. 4, there are a number of configurations that can be used for charge pumps having a single NMOS transistor passgates. DRAM 800 can include an address decoder 892, control circuit 894, and read/write circuitry 896 to operate with respect to a memory-cell array 898. Other components of DRAM 800 are not shown to focus on the example use of charge pumps integrated into semiconductor devices such as but not limited to DRAM 800. In addition, address decoder 892 can be coupled to an address bus, control circuit 894 can be coupled to a control bus, and read/write circuitry 896 can be coupled to a data bus. The pumped output voltages $V_{CCP1} \ldots V_{CCPN}$ generated by the charge pumps 801-1 . . . 801-N can be applied to a number of components within DRAM 800. In addition, generation of one or more of the pumped output voltages $V_{CCP1} \ldots V_{CCPN}$ can be programmed by programming the selection of one or more of the set of charge pumps 801-1 . . . 801-N. An NMOS at an output stage of the one or more charge pumps 801-1 . . . 801-N of the set allows for control of the on/off control of these charge pumps. The one or more charge pumps 801-1 . . . 801-N can be enabled and controlled by logic signals based on current demand, which may be conducted in real-time. With respect to signal processing, by real time is meant completing some signal/data processing within a time that is sufficient to keep up with an external process, such as read and write operations to and from DRAM 800. The control of the set of charge pumps 801-1 . . . 801-N can be implemented using control circuit 894 or other control logic.

Although the set of charge pumps 801-1 . . . 801-N shown in FIG. 8 are associated with DRAM 800, a set of charge pumps as taught herein or variations thereof may be utilized in any type of integrated circuit using a pumped voltage, including other types of nonvolatile and volatile memory devices such as FLASH memories as well as synchronous dynamic random access memories (SDRAMs), static random access memories (SRAMS), and packetized memory devices like synchronous link dynamic random access memories (SLDRAMs). When contained in a FLASH memory, a charge pump circuit as taught herein would typically receive an external programming voltage $V_{PP}$ and generate a boosted programming voltage that can be utilized to erase data stored in blocks of nonvolatile memory cells of such a FLASH memory.

Figure 9:
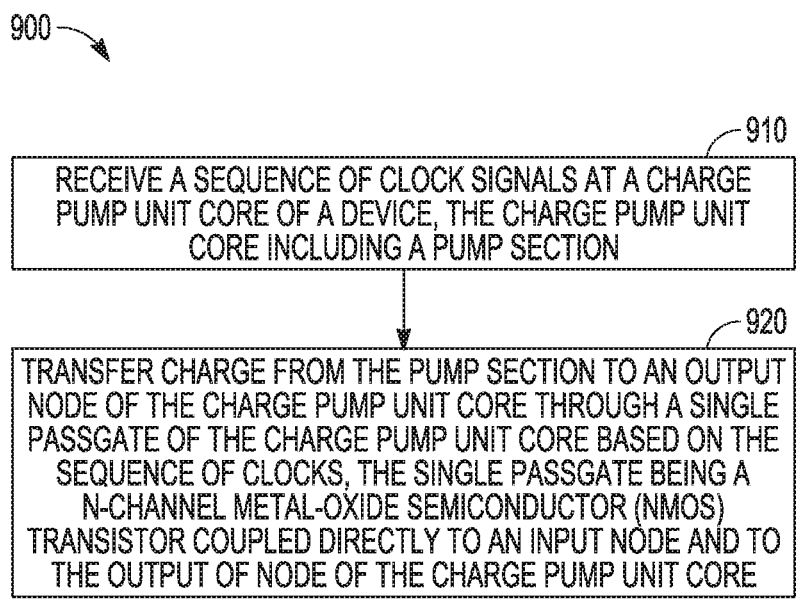
FIG. 9 is a flow diagram of an example method of operating a charge pump, according to various embodiments.

FIG. 9 is a flow diagram of an embodiment of an example method of operating a charge pump. At 910, a sequence of clock signals is received at a charge pump unit core of a device, the charge pump unit core including a pump section. At 920, charge is transferred from the pump section to an output node of the charge pump unit core through a single passgate of the charge pump unit core based on the sequence of clocks, the single passgate being a n-channel metal-oxide semiconductor (NMOS) transistor coupled directly to an input node and to the output of node of the charge pump unit core. Transferring the charge to the output node of the charge pump unit core can include transferring the charge from the pump section of the charge pump unit core through the output node to a pump section of a next charge pump unit core. Transferring the charge can include transferring the charge in response to programming a charge pump in which the charge pump unit core is a component, where the charge pump is one of a set of programmable charge pumps.

Variations of method 900 or methods similar to method 900 can include a number of different embodiments that may be combined depending on the application of such methods and/or the architecture of systems in which such methods are implemented. Such methods can include pre-charging the charge pump unit core using auxiliary transistors coupled to the input of the charge pump unit core, where the charge pump unit core is structured as a first stage of a set of stages of a charge pump. Each charge pump unit core of each stage can have a common layout with an output of the first stage coupled to a combination of the other stages of the set with an input node of a respective stage, after the first stage, coupled to an output of a previous stage.

In various embodiments, a semiconductor device can comprise: a charge pump unit core coupled to receive multiple clock signals, the charge pump unit core including: a pump section; and a single passgate coupled to the pump section to transfer charge based on the multiple clock signals, the single passgate being a n-channel metal-oxide semiconductor (NMOS) transistor coupled directly to an input and an output of the charge pump unit core. A number of different embodiments may be combined depending on the application of such features and/or the architecture of systems in which such features are implemented. The charge pump unit core can include a boost section and a control transistor coupled to the single passgate to control the single passgate and coupled to the boost section. The control transistor can be coupled to a gate of the single passgate and a boost capacitor of the boost section can be coupled to a source of the control transistor. The boost section can include a boost capacitor coupled to a first inverter with the first inverter coupled to receive one of the clock signals, and the pump section can include a pump capacitor coupled to a second inverter with the second inverter coupled to receive another one of the clock signals. The control transistor can be a transistor of a set of transistors to control the passgate. The charge pump unit core can be disposed in an integrated circuit in a mobile communications device.

In various embodiments, a semiconductor device can comprise: nodes to distribute clock signals; and a charge pump having a set of charge pump unit cores, each charge pump unit core coupled to receive a number of the clock signals from the nodes, the set of charge pump unit cores including a charge pump unit having an input node coupled to an output node of another charge pump unit core of the set, each charge pump unit core including: a boost section; a pump section; a single passgate coupled to the pump section to transfer charge with respect to the pump section and the boost section based on the clock signals, the single passgate being a n-channel metal-oxide semiconductor (NMOS) transistor; and a control transistor coupled to the single passgate to control the single passgate and coupled to the boost section. A number of different embodiments may be combined depending on the application of such features and/or the architecture of systems in which such features are implemented.

The set of charge pump unit cores can have a structure arranged with a number of stages coupled to a number of complemental stages, each stage of the number of stages having a charge pump unit core of the set of charge pump unit cores and each stage of the number of complemental stages having a charge pump unit core of the set of charge pump unit cores. The number of stages can be structured with a first stage coupled to a combination of the other stages of the set with an input node of a respective stage, after the first stage, coupled to an output of a previous stage, the input node of the first stage can be coupled to one or more auxiliary transistors, the one or more auxiliary transistors operable to provide pre-charge to the first stage. The boost section of each stage and each complemental stage can include a boost capacitor coupled to a respective first inverter with the respective first inverter coupled to receive a first clock signal, and the pump section of each stage and each complementary stage can include a pump capacitor coupled to a respective second inverter with the respective second inverter coupled to receive a second clock signal, the boost section and pump section of each stage can be arranged to receive the first and second clock signals as complements of the first and second clock signals of its corresponding complementary stage. The number of stages can be two and the number of complementary stages can be two, the two stages and the two complementary stages arranged such that the clock signals received by one of the two stages are the clock signals received by the complement stage of the other one of the two stages.

The structure can include: a first stage followed by a second stage with an input node of the second stage coupled to an output node of the first stage; a first complementary stage followed by a second complementary stage with an input node of the second complementary stage coupled to an output node of the first complementary stage; the first stage including a first set of transistors to control the passgate of the first stage with one transistor of the first set of transistors coupled to the input node of the second complementary stage and coupled to a boost capacitor of the boost section of the first stage; and the first complementary stage including a first complementary set of transistors to control the passgate of the first complementary stage with one transistor of the first complementary set of transistors coupled to the input node of the second stage and coupled to a boost capacitor of the boost section of the first complementary stage.

The structure can include: a first stage followed by a second stage with an input node of the second stage coupled to an output node of the first stage; a first complementary stage followed by a second complementary stage with an input node of the second complementary stage coupled to an output node of the first complementary stage; the first stage including a first set of transistors to control the passgate of the first stage with a first transistor of the first set of transistors coupled to a gate of the passgate of the first stage and a second transistor of the first set of transistors coupled to a boost capacitor of the boost section of the first stage and coupled to a gate of the first transistor of the first set of transistors; and the first complementary stage including a second set of transistors to control the passgate of the first complementary stage with a first transistor of the second set of transistors coupled to a gate of the passgate of the first complementary stage and a second transistor of the second set of transistors coupled to a boost capacitor of the boost section of the first complementary stage and coupled to a gate of the first transistor of the second set of transistors.

The charge pump can be disposed in a memory device. The charge pump can be disposed in a semiconductor device that can include one or more additional charge pumps, where each of the one or more additional charge pumps can have components arranged in accordance with a layout of the charge pump. The charge pump and the one or more additional charge pumps can be programmable.

Figure 10:
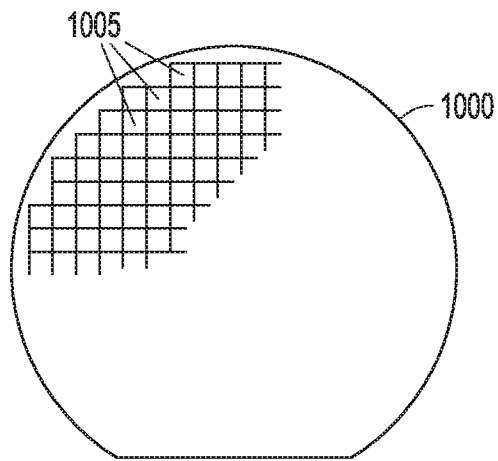
FIG. 10 illustrates an example of a wafer arranged to provide multiple electronic components including a charge pump, according to various embodiments.

FIG. 10 illustrates an embodiment of an example of a wafer 1000 wafer arranged to provide multiple electronic components including a charge pump. Wafer 1000 can be provided as a wafer in which a number of dice 1005 can be fabricated. Alternatively, wafer 1000 can be provided as a wafer in which the number of dice 1005 have been processed to provide electronic functionality and are awaiting singulation from wafer 1000 for packaging. Wafer 1000 can be provided as a semiconductor wafer, a semiconductor on insulator wafer, or other appropriate wafer for processing electronic devices such as an integrated circuit chips.

Using various masking and processing techniques, each die 1005 can be processed to include functional circuitry such that each die 1005 is fabricated as an integrated circuit with the same functionality and packaged structure as the other dice on wafer 1000. Alternatively, using various masking and processing techniques, various sets of dice 1005 can be processed to include functional circuitry such that not all of the dice 1005 are fabricated as an integrated circuit with the same functionality and packaged structure as the other dice on wafer 1000. A packaged die having circuits integrated thereon providing electronic capabilities is herein referred to as an integrated circuit (IC).

Wafer 1000 can comprise multiple dice 1005. Each die 1005 of the multiple dice can be structured with one or more charge pumps. The one or more charge pumps can include a charge pump unit core including a pump section and a single passgate coupled to the pump section to transfer charge based on multiple clock signals, where the single passgate is a n-channel metal-oxide semiconductor (NMOS) transistor coupled directly to an input and an output of the charge pump unit core. The charge pump unit core may be structured in accordance with teachings associated with any of FIGS. 2-9.

Figure 11:
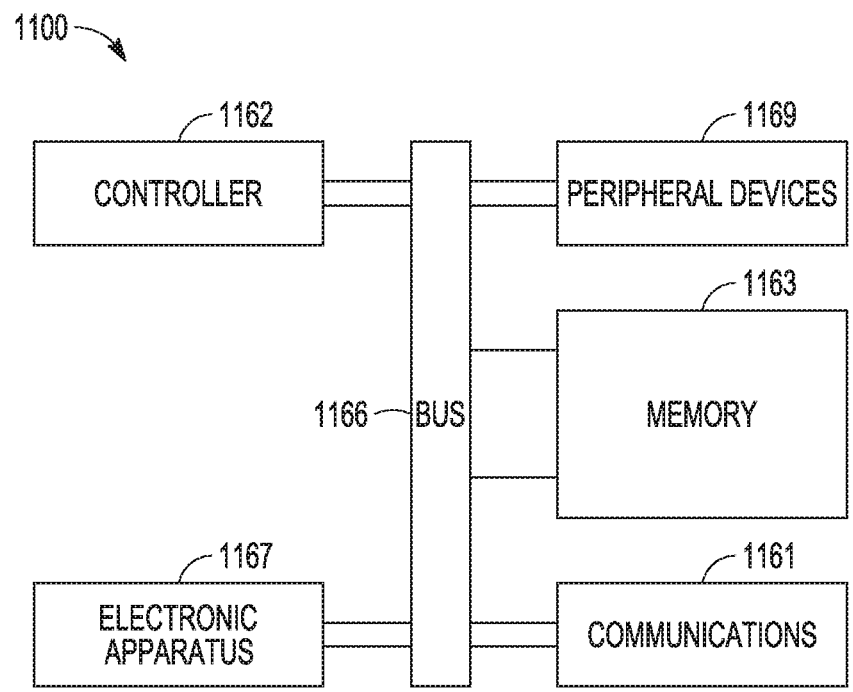
FIG. 11 shows a block diagram of an example system that includes components that can include a charge pump, according to various embodiments.

FIG. 11 shows a block diagram of an embodiment of an example system 1100 that includes components having one or more charge pumps. The one or more charge pumps can include a charge pump unit core including a pump section and a single passgate coupled to the pump section to transfer charge based on multiple clock signals, where the single passgate is a NMOS transistor coupled directly to an input and an output of the charge pump unit core. System 1100 can include a controller 1162 operatively coupled to memory 1163. Controller 1162 can be in the form or one or more processors. System 1100 can also include an electronic apparatus 1167, communication 1161, and peripheral devices 1169. In addition, one or more of controller 1162, memory 1163, electronic apparatus 1167, communications 1161, or peripheral devices 1169 can be in the form of one or more ICs.

A bus 1166 provides electrical conductivity between and/or among various components of system 1100. In an embodiment, bus 1166 can include an address bus, a data bus, and a control bus, each independently configured. In an alternative embodiment, bus 1166 can use common conductive lines for providing one or more of address, data, or control, the use of which is regulated by controller 1162. Bus 1166 may be part of a communications network.

Electronic apparatus 1167 may include additional memory. Memory in system 1100 may be constructed as one or more types of memory such as, but not limited to, DRAM, SRAM, SDRAM, synchronous graphics random access memory (SGRAM), double data rate dynamic ram (DDR), double data rate SDRAM, and magnetic based memory.

Peripheral devices 1169 may include displays, imaging devices, printing devices, wireless devices, additional storage memory, and control devices that may operate in conjunction with controller 1162. In various embodiments, system 1100 includes, but is not limited to, fiber optic systems or devices, electro-optic systems or devices, optical systems or devices, imaging systems or devices, and information handling systems or devices such as wireless systems or devices, telecommunication systems or devices, and computers.

In various embodiments as taught herein, a charge pump having a unit core that includes a NMOS transistor as the only passgate of the unit core can have a layout area that is about half that of a unit core of a conventional pump stage having a combination of PMOS and NMOS passgates. A unit core having a single NMOS transistor as a passgate can provide a higher current capacity when pump output is low, with slightly enhanced current/power efficiency than a unit core having a combination of PMOS and NMOS passgates. In addition, a set of charge pumps, each charge pump having a single NMOS transistor as a passgate, can be programmed by a pump set number based on chip operation. In various embodiments, a charge pump as taught herein can operate without a pre-charge stage, where a pre-charge stage includes a capacitor. A pre-charge stage, having a capacitor, would reduce current/power efficiency. Similar to conventional charge pumps, there may be no body effect for pass-gate devices during charge transferring, where a body effect would cause higher threshold voltage, $V_t$, for passgate devices, which would reduce current/power efficiency. With only one NMOS passgate for one pump stage, passgate size is reduced considerably compared to a conventional charge pump. Smaller passgate device size, less parasitic capacitors, and less extra current consumption during each pump clock cycle, can provide higher current/power efficiency. In addition, because the total device area of the one NMOS passgate charge pump, as taught herein, is smaller than conventional charge pump, such one NMOS passgate charge pumps can have a higher area efficiency than conventional charge pumps having a combination of PMOS and NMOS passgates.

Although specific embodiments have been illustrated and described herein, it will be appreciated by those of ordinary skill in the art that other arrangements derived from the teachings herein may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. Combinations of the above embodiments and other embodiments will be apparent to those of skill in the art upon studying the above description.

What is claimed is:

1. A semiconductor device comprising:
a charge pump unit core coupled to receive multiple clock signals, the charge pump unit core including:
an input to the charge pump unit core and an output from the charge pump unit core;
a pump section;
a single passgate coupled to the pump section to transfer charge based on the multiple clock signals, the single passgate being a n-channel transistor having a drain and a source, with one of the drain or the source coupled directly to the input to the charge pump unit core and with the other one of the drain or the source coupled directly to the output from the charge pump unit core;
a control transistor coupled directly to a gate of the single passgate to control the single passgate, the control transistor being a p-channel transistor; and
a boost section coupled to the control transistor, a boost capacitor of the boost section coupled to a source of the control transistor.

2. The semiconductor device of claim 1, wherein the charge pump unit core includes two transistors configured to generate voltage for all n-channel transistors in the charge pump unit core.

3. The semiconductor device of claim 2, wherein the two transistors are coupled together with one of the two transistors coupled to the input to the charge pump unit core and the other one of the two transistors coupled to the output from the charge pump unit core.

4. The semiconductor device of claim 1, wherein the boost section includes the boost capacitor coupled to a first inverter with the first inverter coupled to receive one of the clock signals; and the pump section includes a pump capacitor coupled to a second inverter with the second inverter coupled to receive another one of the clock signals.

5. The semiconductor device of claim 1, wherein the control transistor is a transistor of a set of transistors arranged to control the single passgate.

6. The semiconductor device of claim 1, wherein the charge pump unit core is disposed in an integrated circuit in a mobile communications device.

7. A semiconductor device comprising:
nodes to distribute clock signals; and
a charge pump having a set of charge pump unit cores, each charge pump unit core coupled to receive a number of the clock signals from the nodes, the set of charge pump unit cores including a charge pump unit core having an input node coupled to an output node of another charge pump unit core of the set, each charge pump unit core including:
an input node to the charge pump unit core and an output node from the charge pump unit core;
a boost section;
a pump section;
a single passgate coupled to the pump section to transfer charge with respect to the pump section and the boost section based on the clock signals, the single passgate being a n-channel metal-oxide semiconductor (NMOS) transistor having a drain and a source, with one of the drain or the source coupled directly to the input to the charge pump unit core and with the other one of the drain or the source coupled to the output from the charge pump unit core; and
a control transistor coupled directly to a gate of the single passgate to control the single passgate and coupled to the boost section, with a boost capacitor of the boost section coupled to a source of the control transistor, the control transistor being a p-channel transistor.

8. The semiconductor device of claim 7, wherein the set of charge pump unit cores has a structure arranged with a number of stages coupled to a number of complemental stages, each stage of the number of stages having a charge pump unit core of the set of charge pump unit cores and each stage of the number of complemental stages having a charge pump unit core of the set of charge pump unit cores.

9. The semiconductor device of claim 8, wherein the number of stages is structured with a first stage coupled to a combination of other stages of the set with an input node of a respective stage, after the first stage, coupled to an output of a previous stage, the input node of the first stage coupled to one or more auxiliary transistors, the one or more auxiliary transistors operable to provide pre-charge to the first stage.

10. The semiconductor device of claim 8, wherein
the boost section of each stage and each complemental stage includes the boost capacitor coupled to a respective first inverter with the respective first inverter coupled to receive a first clock signal; and
the pump section of each stage and each complemental stage includes a pump capacitor coupled to a respective second inverter with the respective second inverter coupled to receive a second clock signal, the boost section and pump section of each stage are arranged to receive the first and second clock signals as complements of the first and second clock signals of its corresponding complemental stage.

11. The semiconductor device of claim 8, wherein the number of stages is two and the number of complemental stages is two, the two stages and the two complemental stages arranged such that the clock signals received by one of the two stages are the clock signals received by the complement stage of the other one of the two stages.

12. The semiconductor device of claim 8, wherein the structure includes:
a first stage followed by a second stage with an input node of the second stage coupled to an output node of the first stage;
a first complemental stage followed by a second complemental stage with an input node of the second complemental stage coupled to an output node of the first complemental stage;
the first stage including a first set of transistors to control the single passgate of the first stage with one transistor of the first set of transistors coupled to the input node of the second complemental stage and coupled to the boost capacitor of the boost section of the first stage; and
the first complemental stage including a first complemental set of transistors to control the single passgate of the first complemental stage with one transistor of the first complemental set of transistors coupled to the input node of the second stage and coupled to a boost capacitor of the boost section of the first complemental stage.

13. The semiconductor device of claim 8, wherein the structure includes:
a first stage followed by a second stage with an input node of the second stage coupled to an output node of the first stage;
a first complemental stage followed by a second complemental stage with an input node of the second complemental stage coupled to an output node of the first complemental stage;
the first stage including a first set of transistors to control the single passgate of the first stage with a first transistor of the first set of transistors coupled to a gate of the single passgate of the first stage and with a second transistor of the first set of transistors coupled to the boost capacitor of the boost section of the first stage and coupled to a gate of the first transistor of the first set of transistors; and
the first complemental stage including a second set of transistors to control the single passgate of the first complemental stage with a first transistor of the second set of transistors coupled to a gate of the single passgate of the first complemental stage and with a second transistor of the second set of transistors coupled to the boost capacitor of the boost section of the first complemental stage and coupled to a gate of the first transistor of the second set of transistors.

14. The semiconductor device of claim 7, wherein the charge pump is disposed in a memory device.

15. The semiconductor device of claim 7, wherein the semiconductor device includes one or more additional charge pumps, each of the one or more additional charge pumps having components arranged in accordance with a layout of the charge pump.

16. The semiconductor device of claim 15, wherein the charge pump and the one or more additional charge pumps are programmable.

17. A method comprising:
receiving a sequence of clock signals at a charge pump unit core of a device, the charge pump unit core including an input node to the charge pump unit core, an output node from the charge pump unit core, a pump section, and a boost section;
transferring charge from the pump section to the output node from the charge pump unit core through a single passgate of the charge pump unit core based on the sequence of clock signals, the single passgate being a n-channel transistor having a drain and a source, with one of the drain or the source coupled directly to the input node to the charge pump unit core and with the other one of the drain or the source coupled directly to the output node from the charge pump unit core; and
controlling the single passgate using a control transistor coupled directly to a gate of the single passgate and coupled to the boost section with a boost capacitor of the boost section coupled to a source of the control transistor, the control transistor being a p-channel transistor.

18. The method of claim 17, wherein transferring charge to the output node of the charge pump unit core includes transferring the charge from the pump section of the charge pump unit core through the output node to a pump section of a next charge pump unit core.

19. The method of claim 17, wherein the method includes pre-charging the charge pump unit core using auxiliary transistors coupled to the input of the charge pump unit core, the charge pump unit core structured as a first stage of a set of stages of a charge pump, each charge pump unit core of each stage having a common layout with an output of the first stage coupled to a combination of other stages of the set with an input node of a respective stage, after the first stage, coupled to an output of a previous stage.

20. The method of claim 17, wherein transferring charge includes transferring the charge in response to programming a charge pump in which the charge pump unit core is a component, the charge pump being one of a set of programmable charge pumps.

* * * * *